United States Patent [19]

Blanchard

[11] Patent Number: 5,457,332
[45] Date of Patent: Oct. 10, 1995

[54] PROCESS FOR MANUFACTURING INTEGRATED CIRCUITS WITH JUXTAPOSED ELECTRODES AND CORRESPONDING INTEGRATED CIRCUIT

[75] Inventor: Pierre Blanchard, Echirolles, France

[73] Assignee: Thomson-CSF Semiconducteurs Specifiques, Puteaux, France

[21] Appl. No.: 30,052

[22] PCT Filed: Jul. 10, 1992

[86] PCT No.: PCT/FR92/00673

§ 371 Date: Mar. 12, 1993

§ 102(e) Date: Mar. 12, 1993

[87] PCT Pub. No.: WO93/02469

PCT Pub. Date: Feb. 4, 1993

[30] Foreign Application Priority Data

Jul. 16, 1991 [FR] France ............... 91 08953

[51] Int. Cl.⁶ ............... H01L 31/18; H01L 21/82
[52] U.S. Cl. ............... 257/250; 437/186; 437/50; 437/53
[58] Field of Search ............... 257/758, 249, 257/250, 509; 437/50, 53, 186

[56] References Cited

U.S. PATENT DOCUMENTS

| | | | |
|---|---|---|---|
| 4,251,571 | 2/1981 | Garbarino et al. | 437/53 |
| 4,352,237 | 10/1982 | Widmann | 257/249 |
| 4,742,027 | 5/1988 | Blanchard et al. | 437/50 |
| 5,135,889 | 8/1992 | Allen | 437/50 |
| 5,219,768 | 6/1993 | Okita | 437/186 |
| 5,346,838 | 9/1994 | Ueno | 437/50 |

FOREIGN PATENT DOCUMENTS 0209425  6/1986  European Pat. Off. .
0435257 12/1990  European Pat. Off. .
0204165 12/1982  Japan ............... 437/53

OTHER PUBLICATIONS

IBM TDB, vol. 20, No. 4, Sep. 1977, pp. 1430–1432.
IBM TDB, vol. 20, No. 1, Jun. 1977, p. 131.
List of U.S. patent applications and patents by the Inventor.

*Primary Examiner*—Robert P. Limanek
*Assistant Examiner*—Alexander Oscar Williams
*Attorney, Agent, or Firm*—Roland Plottel

[57] ABSTRACT

The invention relates to integrated circuits and their manufacture.

A process is described for producing electrodes juxtaposed very close together, such as those encountered in charge-coupled shift registers. According to the invention, a first polycrystalline-silicon layer (14) is deposited and a localised oxidation is performed over a small width, in order to tcwtcwdivide the layer into two electrodes (15 and 17). The layer zone which has been oxidised between the two electrodes is then totally deoxidised, in order to produce a hollowed-out space in which it will be possible to house a third electrode (38). This third electrode, also made from polycrystalline silicon, is deposited after a slight insulating layer has been reformed on the side walls of the electrodes 15 and 17. As the width of the hollowed-out space between the two first electrodes is small, a polycrystalline-silicon overthickness is formed. It remains only to etch the silicon over the thickness of the deposited layer in order for electrodes to remain only in the zones which had an overthickness. A third electrode has thus been formed very close to the first two yet without overlap other than on the side walls of the first two.

8 Claims, 1 Drawing Sheet

5,457,332

PROCESS FOR MANUFACTURING INTEGRATED CIRCUITS WITH JUXTAPOSED ELECTRODES AND CORRESPONDING INTEGRATED CIRCUIT

BACKGROUND OF THE INVENTION

The invention relates to integrated circuits.

In certain applications, and mention will be made by way of example of charge-coupled devices, there is a need to produce electrodes side by side which are very close to each other but which do not overlap too much in order not to create too high a parasitic capacitance between the two electrodes and, in the case of photosensitive devices, in order for the photosensitivity not to be reduced by this overlap.

For example, in a charge-coupled register, electrodes are juxtaposed so that a packet of charges stored in a semiconductor substrate beneath one electrode can be transferred beneath an adjacent electrode by simply applying suitable potentials to the electrodes. If the electrodes are not sufficiently close to each other the transfer runs the risk of being incomplete. However, in order to produce electrodes very close together, existing techniques require in practice a partial overlap (with intermediate insulation) of one electrode by the other to be provided.

SUMMARY OF THE INVENTION

The invention provides a novel manufacturing process intended to improve the production of integrated circuits having to have electrodes juxtaposed very close together.

According to the invention, it is essentially provided to deposit a first silicon layer onto a substrate, to deposit on top of this layer an oxidation-preventing masking layer (preferably made from silicon nitride or a conventional combination of silicon oxide and silicon nitride), to photoetch the masking layer in order to open up the latter over a small width, to oxidise, over its entire thickness, the first silicon layer at that place where it is not masked, to remove the silicon oxide formed during this oxidation, which forms an upwardly-open hollowed-out space delimited by the first silicon layer at that place where it has not been oxidised and by the oxidation-preventing masking layer, to form a thin insulating layer on the side walls of the first layer along the edges of the hollowed-out space, to deposit a second silicon layer totally filling this space, the ratio between the width of the hollowed-out space and the thickness of the second silicon layer being chosen to be sufficiently small for the silicon thickness of the second layer inside the hollowed-out space to be higher than outside and, finally, to remove the totality of the thickness of the second layer from outside the hollowed-out space while allowing silicon to remain in this space.

The approximate maximum value of the ratio between the width of the hollowed-out space and the thickness of the second silicon layer is roughly 2 to 4. It should be noted that this value is given above all by way of indication, the important point being the final result, that is to say the possibility of forming an overthickness in the hollowed-out space such that, even after etching of the totality of the thickness of the second silicon layer, a complete silicon layer coming into contact with the insulated side walls of the first layer remains in the opening. By way of example, with current low-pressure vapour-phase processes for depositing polycrystalline silicon, it is possible to have a width of the hollowed-out space up to roughly 1.5 micrometers wide for a thickness of roughly 1 micrometer of the second silicon layer.

Most of the time the invention will be used for electrodes deposited on top of a thin insulating layer; as a consequence, in this case, it is necessary to consider that the substrate is a semiconductor substrate covered with a thin insulating layer (silicon oxide and/or silicon nitride a few hundreds of angströms thick); the first silicon layer is deposited onto this thin insulating layer; and if the second electrode has also to be deposited onto an insulating layer, it is envisaged that, after the step for removing the oxide formed by oxidation of the first silicon layer, a thin insulating layer is reformed on the substrate in the opening left free.

After forming the electrodes in the manner indicated hereinabove, it is possible to remove the masking layer, totally or partially, or else it may be left.

The invention also relates to a novel integrated-circuit structure having close-together electrodes, which is characterised by the make-up of these close-together electrodes. The structure according to the invention, particularly compact and having a low parasitic capacitance between the electrodes, includes a first electrode and a second electrode on either side of a third electrode, the third electrode being separated from the first and second by a thin insulating layer extending along an oblique side wall of the first and second electrodes, the overlap between the electrodes thus juxtaposed taking place essentially solely along this oblique side wall.

This structure is particularly advantageous in that the overlap is very small, but it does exist all the same: as a result there is no uncontrolled substrate zone between two electrodes.

Other characteristics and advantages of the invention will appear on reading the detailed description which follows and which is given with reference to the attached drawings in which:

DETAILED DESCRIPTION OF THE INVENTION

The invention will be principally described in connection with juxtaposed electrodes covering a semiconductor with interposition of a thin insulating layer between the semiconductor and the electrodes. In fact, this case is the most advantageous and finds one application especially in the case of charge-coupled devices, for example for the production of the electrodes for a shift register.

The starting point is a substrate 10 which may be made up by a silicon substrate 10 covered with an insulating layer 12. The insulating layer will most often be a silicon oxide about one hundred or a few hundreds of angströms thick, or else a superposition of a thin silicon-oxide layer of a few hundreds of angströms and of a thin silicon-nitride layer of a few tens to a few hundreds of angströms.

A first silicon layer 14 is uniformly deposited onto the substrate thus made up, that is to say onto the insulating layer 12. The deposition is preferably a deposition by chemical decomposition (generally from silane) in the gas phase, leading to a polycrystalline silicon layer a few thousands of angströms thick.

Onto the first silicon layer 14 is uniformly deposited a silicon-oxidation-preventing masking layer 16, that is to say a layer capable of preventing the oxidation of the silicon at that place where this layer covers the silicon. The masking layer 16 is preferably made up essentially by silicon nitride, with, possibly, a thin silicon-oxide layer (not shown) between the layer 14 and the layer 16, essentially for improving the integrity of the layer 16 and subsequently for facilitating the photoetching of this layer 16.

Figure 1:
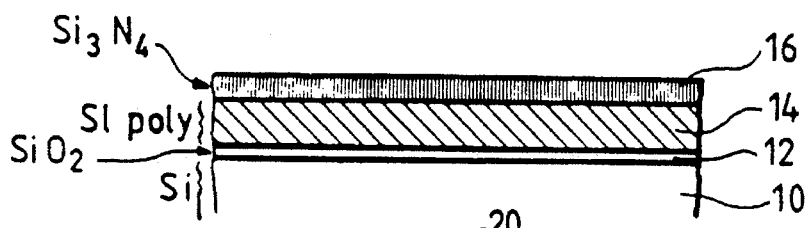
FIG. 1 to 6 show the successive steps of the process according to the invention.

FIG. 1 shows the structure at this stage of manufacture.

The first silicon layer will serve to form a first and a second electrode; a third electrode will be formed between the first two, thus leading to the formation of three electrodes juxtaposed as desired.

Figure 2:
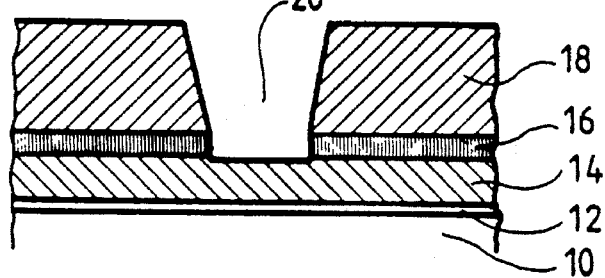

The nitride layer 16 is photoetched (FIG. 2) in order to define openings; each opening divides the first polycrystalline-silicon layer 14 into two separate electrodes 15 and 17 separated by the opening, the width of the opening being sufficient for subsequently housing therein a third electrode.

In order to do this, the nitride layer 16 is covered with a photosensitive resin 18 in which an opening 20 is defined by photolithography. The nitride layer 16 is opened up, by plasma etching, at that place where it is not protected by the resin, so that a visible polycrystalline-silicon surface (or a surface possibly covered with a thin silicon-oxide layer) is obtained in the opening 20. It should be noted that other processes for etching an opening in the silicon nitride could be conceived, provided that it leads to an opening of relatively small width in the nitride. The figures show cross-sections in the direction of the width of the opening. The length is of no importance. The width of the opening in the nitride is preferably at most equal to roughly twice the thickness of a polycrystalline-silicon layer which will subsequently be deposited and will serve for making up the third electrode; in practice, the second silicon layer will have a thickness of the order of 5000 angströms and the width of the opening in the silicon should then not exceed roughly 1 to 1.5 micrometers, preferably 1 micrometer.

The resin is removed at this stage and a thermal oxidation step is then carried out in the presence of oxygen or, more often, water vapour, and at elevated temperature (of the order of 1000° C.). The thermal oxidation is continued until oxidation of the entire thickness of the silicon layer 14 at the place where the latter is not protected by the nitride.

Figure 3:
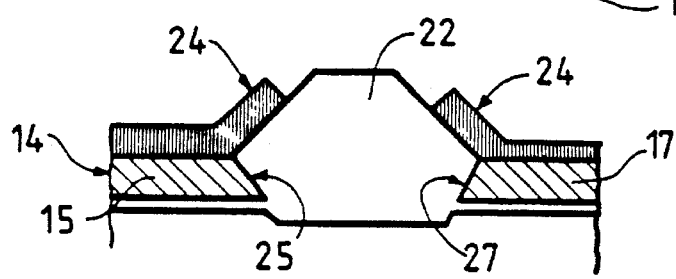

In FIG. 3 is recognised the conventional shape with bird's bill of the silicon oxide 22 thus produced in the opening of the nitride. The thermal oxide produced is thicker (roughly 50% more) than the silicon layer 14. In addition, the boundary between the oxide and the non-oxidised part of layer 14 defines an oblique side wall 25, 27 of the electrodes 15 and 17. The oblique side wall of the electrodes is turned upwards. Finally, the edges 24 of the nitride layer 16 are raised up by the growth of the oxide 22.

Figure 4:
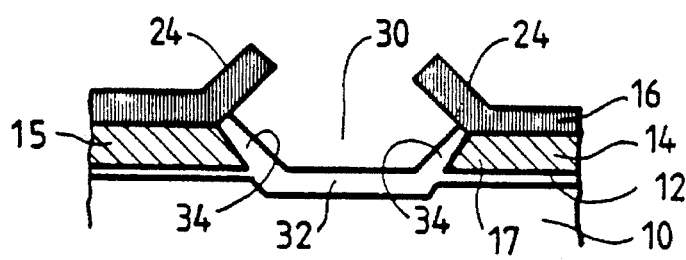

Then a deoxidation step is carried out, that is to say the substrate is chemically etched until the layer 22 disappears (FIG. 4). This etching hollows out an upwardly-open space 30 defined by:

at the bottom, the silicon substrate 10;

on the right and left respectively the side walls of the electrodes 15 and 17, at the top, partially by the nitride edges 24 which were resting on the oxide 22 and which remain overhanging;

for the remainder, the hollowed-out space 30 remains upwardly open between the nitride edges 24 which face each other, one on the side where the electrode 15 is situated, the other on the side where the electrode 17 is situated.

A thin insulating layer which covers, on the one hand, the silicon of the substrate at the bottom of the hollowed-out space 30 and, on the other hand, the side walls of the electrodes 15 and 17, is then formed preferably by thermal oxidation of the silicon. This layer is designated by 32 at the bottom of the space and by 34 on the side walls of the electrodes. The zone 32 is only provided if the electrode, which will subsequently be deposited, has to be isolated from the substrate.

A second polycrystalline-silicon layer 36 is then deposited, with a thickness E sufficient for the silicon not only to fill up the entire hollowed-out space 30 but even so that it forms an overthickness (total thickness E') in this entire space. Practically, in the case of a deposition by gas-phase chemical decomposition, this overthickness is formed on top of the entire space 30 from the moment when the thickness of the deposited layer is sufficient, that is to say greater than roughly half the width of the hollowed-out space, between the side walls of the electrodes 15 and 17.

Figure 5:
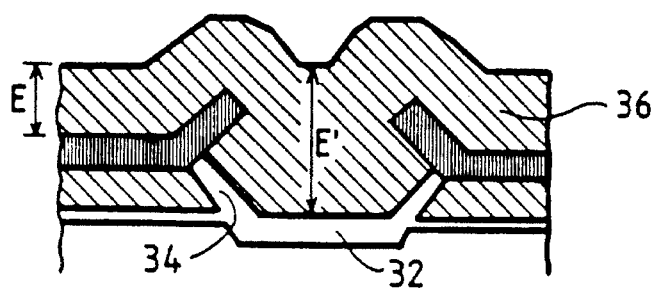

FIG. 5 shows the structure at this stage of the manufacture.

As may be seen, by virtue of the silicon nitride 16 and by virtue of the insulating layers 32 and 34, the second silicon layer 36 is completely isolated electrically from the first inside the hollowed-out space 30 which it fills.

Figure 6:
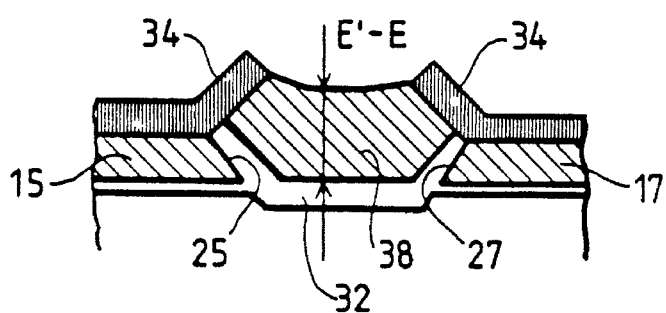

The next step is a uniform etching of the silicon of the second layer (FIG. 6), down to a depth at least equal to the thickness E of this layer, but less than the thickness E'. The ideal would be to remove exactly the depth E, but it is more reliable to etch down to a depth slightly greater than E in order to be sure that no silicon remains outside the hollowed-out spaces 30.

Polycrystalline silicon therefore remains in the space 30, with a thickness of roughly E'–E (which is of the order of the thickness E or a little less). This silicon makes up an electrode 38 placed between the electrodes 15 and 17; it is very close to both these electrodes since it is separated from them only by a thin insulating layer 34 which can be very thin (a few tens of angströms if desired) with an overlap between the electrodes which is, however, very small since it exists only along the oblique side walls 25 and 27 of the electrodes 15 and 17. However, the small overlap remains, by virtue of the oblique side walls, so that there is no uncontrolled substrate zone as would be the case if non-overlapping electrodes were juxtaposed with a vertical gap between them. This is particularly important for the electrodes of a charge-coupled device.

I claim:

1. Process for manufacturing integrated circuits having electrodes juxtaposed very close together and in a slightly overlapping relationship, characterised in that a first silicon layer (14) is deposited on a substrate (10, 12), an oxidation-preventing masking layer (16) is deposited on top of this layer, the masking layer is photoetched in order to open up the latter over a small width (20), the first silicon layer (14) is oxidized over its entire thickness at that place where it is not masked, to form a layer of silicon oxide thereof thicker than that of the silicon layer where it is not masked the silicon oxide formed during this oxidation is removed, which forms an upwardly-open hollowed-out space (30) delimited by the sloped side walls of the first silicon layer at the edges where it has not been oxidized and by the upwardly turned edge of the masking layer, a thin insulating layer (34) is formed on the side walls of the first layer along the edges of the hollowed-out space, a second silicon layer

(36) totally filling this space is deposited, the ratio between the width of the hollow-out space and the thickness E of the second silicon layer being chosen to be sufficiently small for the silicon thickness E' inside the hollowed-out space to be greater than the thickness E outside and, finally, a predetermined thickness of silicon of the second layer is uniformly removed above the hollowed-out space and outside the hollowed-out space, said predetermined thickness being comprised between thickness E and thickness E' so that no silicon remains outside the hollowed-out space along the edges of said space, while silicon remains within the hollowed-out space.

2. Process according to claim 1, characterised in that the approximate maximum value of the ratio between the width of the hollowed-out space and the thickness of the second silicon layer is roughly 2 to 4.

3. Process according to claim 1 or 2, characterized in that the substrate (10–12) comprises a semiconductor (10) covered with a thin insulating layer (12) on which the first silicon layer (14) is deposited.

4. Process according to claim 1 or 2, characterized in that, after the step for removing the oxide formed by oxidation of the first silicon layer, a thin insulating layer (32) is reformed on the substrate in the opening left free by this removal.

5. Integrated-circuit structure having close-together electrodes, comprising a first electrode (15) and a second electrode (17) made of portions of a first silicon layer on either side of a third electrode made of a portion of a second silicon layer, characterized in that the third electrode is separated from the first and second electrodes by a thin insulating layer (34) extending along an oblique side wall (25, 27) of the first and second electrodes, the overlap between the electrodes thus juxtaposed taking place essentially solely along this oblique side wall, the slope of the oblique side wall being a slope of the type which is obtained through a local oxidation of the first silicon layer over its entire thickness.

6. Integrated-circuit structure according to claim 5, characterised in that the electrodes are the electrodes of a charge-coupled device.

7. A process according to claim 1, wherein said electrodes are electrodes of a charge coupled device.

8. A process for manufacturing electrodes of an integrated circuit charge-coupled device having said electrodes juxtaposed very close together and in a slightly overlapping relationship, comprising the steps of:

(a) depositing a first silicon layer (14) on a substrate (10, 12), (b) depositing an oxidation-preventing masking layer (16) on top of this layer, (c) making an opening with a small width (20) in said masking layer, (d) oxidizing the first silicon layer (14) over its entire area where it is not masked, (e) removing the silicon oxide formed during this oxidation, which forms an upwardly-open hollowed-out space (30) delimited by the first silicon layer at that place where it has not been oxidized and by the masking layer, (f) forming a thin insulating layer (34) on the side walls of the first layer along the edges of the hollowed-out space, (g) filling the space with a second silicon layer (36), in which the ratio between the width of the hollowed-out space and the thickness E of the second silicon layer being chosen to be sufficiently small and for the silicon thickness E' inside the hollowed-out space to be greater than the thickness E outside and, (h) uniformly removing a predetermined thickness of silicon of the second layer above the hollowed-out space and outside the hollowed-out space, said predetermined thickness being greater than thickness E and less than thickness E' so that no silicon remains outside the hollowed-out space along the edges of said space, while silicon remains within the hollowed-out space; whereby separated portions of said first silicon layer (15, 17) forms a pair of electrodes and a remaining portion (38) of said second silicon layer totally within the hollowed-out space forms a third electrode of the integrated circuit charge-coupled device.

* * * * *